(12) United States Patent
Storkey

(10) Patent No.: US 8,378,662 B2
(45) Date of Patent: Feb. 19, 2013

(54) CURRENT SENSOR

(76) Inventor: Matthew Emmanuel Milton Storkey, Cambridge (GB)

( * ) Notice: Subject to any disclaimer, the term of this patent is extended or adjusted under 35 U.S.C. 154(b) by 837 days.

(21) Appl. No.: 12/162,127

(22) PCT Filed: Oct. 7, 2006

(86) PCT No.: PCT/EP2006/009710
§ 371 (c)(1),
(2), (4) Date: Jul. 24, 2008

(87) PCT Pub. No.: WO2007/085278
PCT Pub. Date: Aug. 2, 2007

(65) Prior Publication Data
US 2010/0109643 A1    May 6, 2010

(30) Foreign Application Priority Data

Jan. 24, 2006   (GB) .................................. 0601383.3

(51) Int. Cl.
*G01R 15/18*   (2006.01)

(52) U.S. Cl. ...................................................... 324/127
(58) Field of Classification Search ................ 324/117 H
See application file for complete search history.

(56) References Cited

U.S. PATENT DOCUMENTS 6,452,413 B1 *  9/2002  Burghartz ................ 324/117 H
6,734,661 B2 *  5/2004  Colby et al. .................. 324/142

* cited by examiner

Primary Examiner — Roberto Velez
(74) Attorney, Agent, or Firm — Thorpe North & Western LLP

(57) ABSTRACT

The present invention is a current sensor architecture using a planar coils in close proximity to a current conductor to detect the rate of change of current in the conductor (and hence, by using an integrator, to recover the AC current). The current sensor is optimised to reject uniform external magnetic fields, gradient external magnetic fields, and fields from one or more conductor assemblies in fixed locations in close proximity to the current sensor, such as might be found in a polyphase electric meter with multiple current sensors.

18 Claims, 9 Drawing Sheets

CURRENT SENSOR

FIELD OF THE INVENTION

This invention relates to the field of electrical current sensing and in particular to a sensing device for use as an AC current sensor used in fiscal electricity metering for measuring energy, current and power quality.

BACKGROUND

Current sensors for electricity metering are often subject to a number of requirements. These may include:
1. Defined geometry of current circuit connections
2. Multiple, adjacent, independent sensors, closely spaced.
3. Excellent immunity to external AC field (either from nearby conductors or from attempts to tamper)
4. Substantially complete immunity to DC magnetic field
5. Low cost
6. Wide dynamic range (typically >=1000:1)
7. Good linearity (typically 0.2%)

DEFINITIONS

When analysing the effect of a magnetic system in free space it is useful to look at the properties of the field response of the system in different regions of space.

The near-field is the region in close proximity to the magnetic system where the effects of the detailed structure of the magnetic system are dominant.

The far-field is the region where the interaction distance from the magnetic system is much greater than any of the dimensions of the magnetic system itself. In this region the field response can be described by simple equations.

The mid-field region is the region of transition between these two regions where the interaction is outside the magnetic system, but still in close enough proximity to be dependent on the detailed structure of the magnetics.

Existing Sensors

Published U.S. Pat. No. 6,414,475 and U.S. Pat. No. 6,734,661 describe current sensors that respond to magnetic field generated by current flowing in a conductor connected to a load. These sensors both use planar coil structures that couple to the field induced by a current flowing in a conductor in close proximity to the coils. They respond to the rate of change of current in the conductor, and the integrated signal is extremely linear with current over a wide dynamic range. They achieve their linearity because they contain no permeable materials, which mean there is no material either to magnetise or to saturate. As they contain no magnetic shielding, they have complete immunity to DC magnetic field. They achieve good rejection of uniform and gradient AC magnetic fields. U.S. Pat. No. 6,414,475 achieves this by using a set of coils consisting of two opposing co-located magnetic dipoles. U.S. Pat. No. 6,734,661 integrates two such sets of dipoles, overlapping and offset from each other, into its coil structure.

However, both of these existing sensors respond somewhat to the field generated by currents with a path that is in the mid-field range of the sensor. If the device requires more than one measurement of current, the system can not achieve good isolation between channels without a significant minimum spacing between current sensors. In an IEC form three-phase electricity meter for example there is a requirement for the measurement of current in each phase to be independent. At the same time there is a requirement to measure the currents of three or four channels whose terminals are in close proximity.

None of the known solutions are able to meet all of the requirements stated above, in particular the ability to place multiple sensors in close proximity with minimal interference, such as might be implemented in a polyphase electricity meter with bottom-entry current terminals, where the terminals of separate current circuits are adjacent and in close proximity.

SUMMARY OF THE INVENTION

It is therefore an object of the present invention to provide a current sensor that fulfils the above mentioned requirements and is at the same time substantially immune to signals from neighbouring conductors and/or connectors. The present invention describes a current sensor. It uses a novel planar coil structure for the measurement of the magnetic field generated by a current in a conductor in the near-field, responding to the rate of change current through said conductor. At the same time it does not respond to the field from a current in a path that is a defined distance from the centre, i.e. in a directly neighbouring conductor and sensor coil, nor to conductors and sensor coils assemblies adjacent to these, in the mid-field region. This is achieved while maintaining the immunity to uniform and gradient magnetic fields and improving immunity to fields produced by distant conductors compared to the existing art.

The invention according to preferred embodiments uses three or more dipole coil segments with co-located magnetic centres. These can be optimised to maximise the sensitivity to the local current carrying conductor. They are balanced substantially to eliminate any response to uniform and gradient magnetic fields. The choice of dipoles of appropriate areas per turn and number of turns substantially eliminates any response to conductors at known distances—typically achieving current rejection ratios of around 10000:1.

The present invention is realized in a number of aspects of which a first is a current sensor comprising a coil arrangement with an equivalent coil structure of at least three sense coil segments arranged to be located in close proximity to a first current conductor, characterised in that the coils are mounted in fixed relation in at least one direction to the current conductor and that a magnetic centre of each coil segment is co-located with each other and connected so a combined response of signals relative the current in the current conductor from the sense coils is proportional to the rate of change of current in the current conductor, and is substantially insensitive to a uniform external AC magnetic field, to a first-order gradient AC magnetic field, and to current in at least a second current-carrying conductor in a defined location relative the first conductor.

Each turn of a second equivalent sense coil may enclose each turn of a first equivalent sense coil, and each turn of a third equivalent sense coil may enclose each turn of both the first and second equivalent sense coils.

The three or more equivalent sense coils may be connected together in series and arranged such that the electromagnetic forces induced in each of the coils by a uniform AC magnetic field sum substantially to zero in the coil arrangement (6).

At least a portion of the first current-carrying conductor may be substantially hairpin in shape, such that the magnetic field produced by current flowing in the conductor falls off faster with distance than the field from a straight conductor of similar dimensions.

The first current-carrying conductor may generate magnetic field from the current flowing in the conductor that falls off faster with distance than the field from current flowing in a straight conductor of similar dimensions.

The three or more equivalent sense coils may lie in one or more planes that are substantially parallel to each other. The equivalent sense coils may be disposed on or in a substantially planar support. Each equivalent sense coil may comprise a plurality of turns. The three or more equivalent sense coils may each have different turns-area.

A sum of the turns-area of the three or more equivalent sense coils, taking into account the sense of the winding by the sign of the turns-area product, may be substantially zero.

A turns-area of one of the equivalent sense coils may be substantially equal to the sum of the turns-area of the other two sense coils.

The equivalent sense coils may be fabricated on one or more layers of a printed circuit board.

The printed circuit board may also comprise electrostatic shield layers disposed between the conductor and the three or more equivalent sense coils.

The first current conductor may be formed on one or more layers of the printed circuit board.

The printed circuit board may also have signal conditioning or other electronic components disposed on one or more surfaces.

Another aspect of the present invention, an arrangement of sensors is provided in accordance to above described first aspect, wherein the arrangement is permanently arranged and optimised such that the response of each separate sensor to current flowing in the immediately adjacent sensor or sensors is substantially zero.

The arrangement may further be characterised in that the response of each sensor to current in every other sensor in the arrangement is substantially zero.

Yet another aspect of the present invention is provided: a watt-hour electricity meter arranged with at least one sensor according to any the first aspect of the invention and arranged with means for measuring at least one of electrical energy, power, and current. The meter may further comprise communication means for communicating measurements to an external device.

BRIEF DESCRIPTION OF THE DRAWINGS

Embodiments of the invention will now be described, by way of example, with reference to the accompanying drawings, in which.

DETAILED DESCRIPTION OF THE INVENTION

Terminal-based polyphase electricity meters typically have three or four adjacent pairs of terminals for connection to the current circuits. These are generally arranged as equally-spaced terminals along the bottom edge of the meter, with a typical terminal pitch of 12-15 mm. Within each pair, the left-hand terminal generally connects to the line (source) and the right hand terminal connects to the load, for a particular phase. In a three-phase system, the current circuits for each phase will be adjacent to each other, and additionally a fourth pair of terminals may be present for the neutral circuit.

Figure 1:
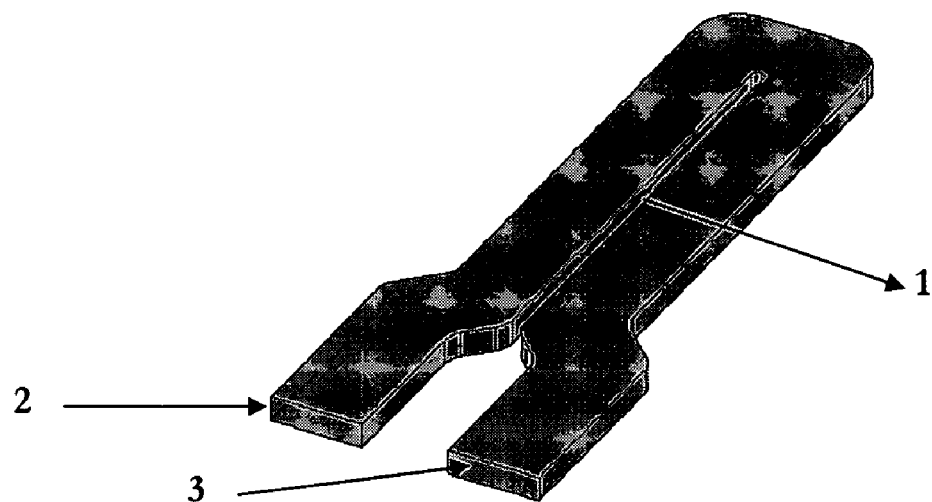
FIG. 1 illustrates a current-carrying conductor (bus bar) according to one embodiment of the present invention designed to generate a dipole magnetic field, and suitable for use in a three phase IEC form electricity meter.
Figure 2:
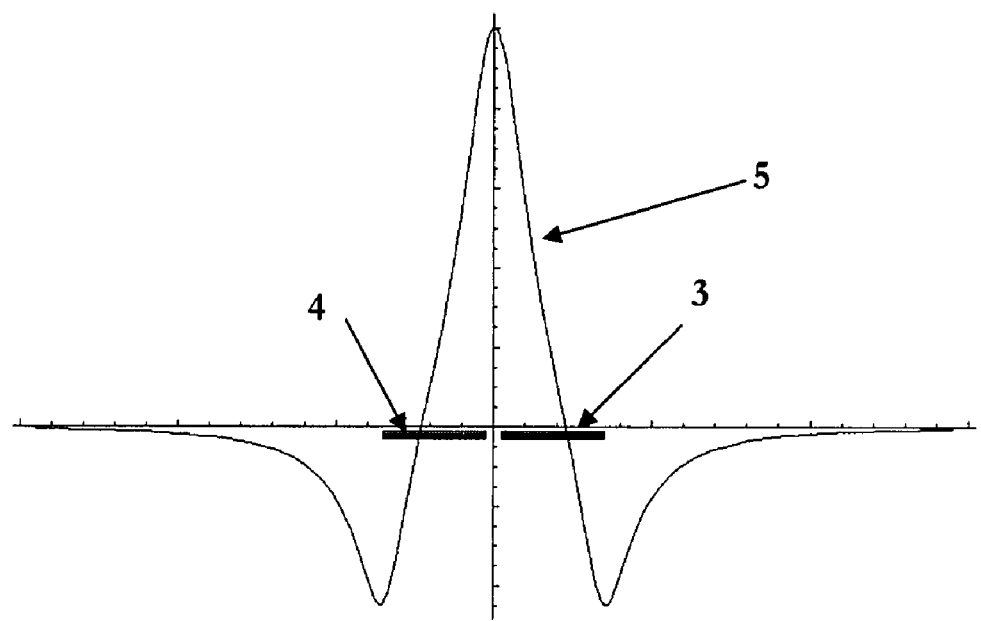
FIG. 2 illustrates a cross section of the field perpendicular to the plane of the bus bar in FIG. 1, generated by a current flowing in a similar bus bar, placed at a distance given by the x axis in millimetres from the bus bar, in the direction along the plane of the bus bar but perpendicular to the slot in the bar.

An appropriate conductor to carry the current to be measured is a hairpin shape, shown in FIG. 1. The two ends of the bus bar 2 and 3 are spaced according to the geometry of the terminals of an IEC (International Electrotechnical Commission) three phase electricity meter, where 2 is the source of the current and 3 is the load. FIG. 2 shows the magnetic field perpendicular to the plane of the conductor generated by current travelling in the conductor along 3. The hairpin shape of the conductor 1 effectively forms a dipole, and has the effect of reducing the far-field much more rapidly than a single straight conductor, for which the field falls off relatively slowly (as 1/distance). The additional length of the hairpin provides more length of conductor to generate field, thereby increasing the field that couples to the sense coils.

Figure 3:
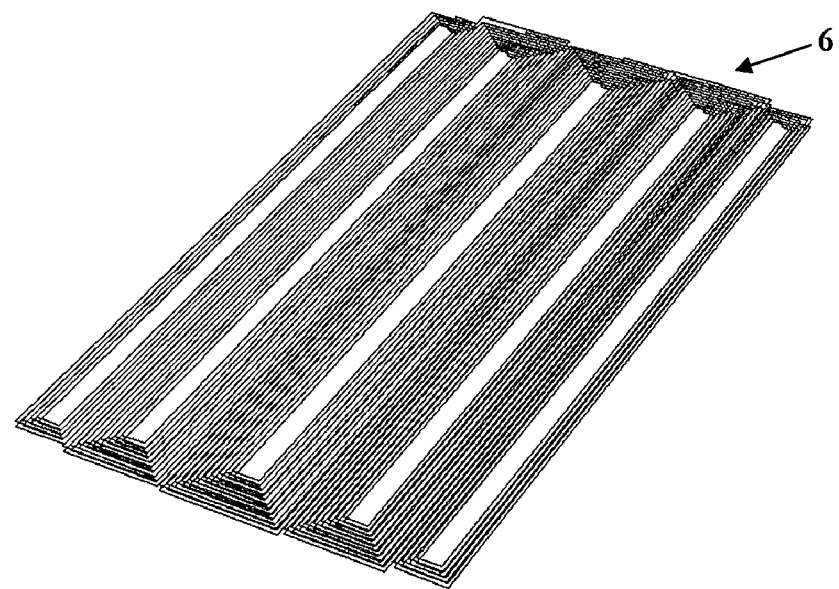
FIG. 3 illustrates an embodiment according to the present invention of a coil-set optimised to measure the current in a bus bar while rejecting current from other neighbouring bus bars and sources of magnetic interference.

The planar coil arrangement in FIG. 3 is rigidly fixed parallel to the plane of and directly below or above the bus bar and the current in the bus bar creates a field which in turn induces an electric magnetic force (EMF) in the coil structure 6, proportional to the rate of change of current. By integrating the rate of change current signal obtained it is possible to deduce the AC current; this can for instance be done in an integrator circuit or in a processing device which has acquired the signal. The coil is magnetically equivalent to three dipoles 7, 8, 9 (shown in FIGS. 5, 7, 9) with co-located magnetic centres, connected in series. The three coil segments each have an average area per turn and a number of turns. If the turns area of all the coils are added (taking a coil in a clockwise sense as a positive turns area and an anticlockwise sense as a negative area) then the total is substantially zero. This is referred to as a balanced coil.

Figure 4:
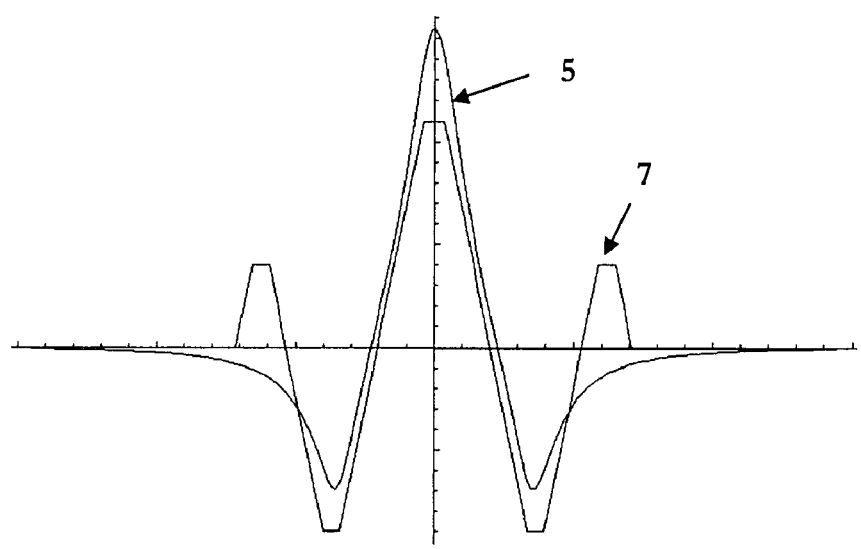
FIG. 4 illustrates the response of a coil arrangement matched to the field of a bus bar.

The coil 6 is arranged so that the sensitivity to field closely represents the field generated by the bus bar 1. FIG. 4 shows the bus bar field 5 overlaid with the approximate field response 7 of the coil arrangement. As the resultant EMF is the product of the two curves, the positive and negative parts of the field response both contribute to sensitivity of the output to the current.

The far field response is effectively eliminated by the constraint that the sum of all the turns-area is set to be zero. The response to uniform field is dependent on this total and therefore is substantially zero. The three magnetic dipoles are designed to have substantially co-located centres. The response to first-order gradient magnetic field is therefore also zero as the symmetry of structure about the magnetic dipole centres is maintained.

The mid-field response of a particular dipole coil is dependent on the area over which the coil extends. The response of a small coil will not extend as far as the response of a large coil. With a balanced pair of coils segments (such as in U.S. Pat. No. 6,414,475), the response to a current path in the mid-field will be dominated by the larger coil segment. This will result in a small but significant response to current in a bus bar in a neighbouring sensor. By using more than two coils (such as the three in this particular embodiment) the sensor can be engineered to have a null in the response to a known current path at a known distance. The response at a certain midfield distance can be balanced by changing the proportional area of the different coil segments while still maintaining the constraint that the total turns-area is zero.

The arrangement in FIG. 3 has a null in the response for an identical bus bar placed at 29 mm from the bus bar being measured. Since this is a linear system, and the coils are in series, the overall response is the sum of the responses of each dipole segment in the design. Each of the three dipole segments has a different response at this distance, which will be illustrated below. However, it should be understood that the example in FIG. 3 is only illustrative and not limiting to the invention regarding any design characteristics for responses to any other bus bars within range. The distance 29 mm is only illustrative and the response function can be designed for any other suitable distance depending on application.

Figure 5:
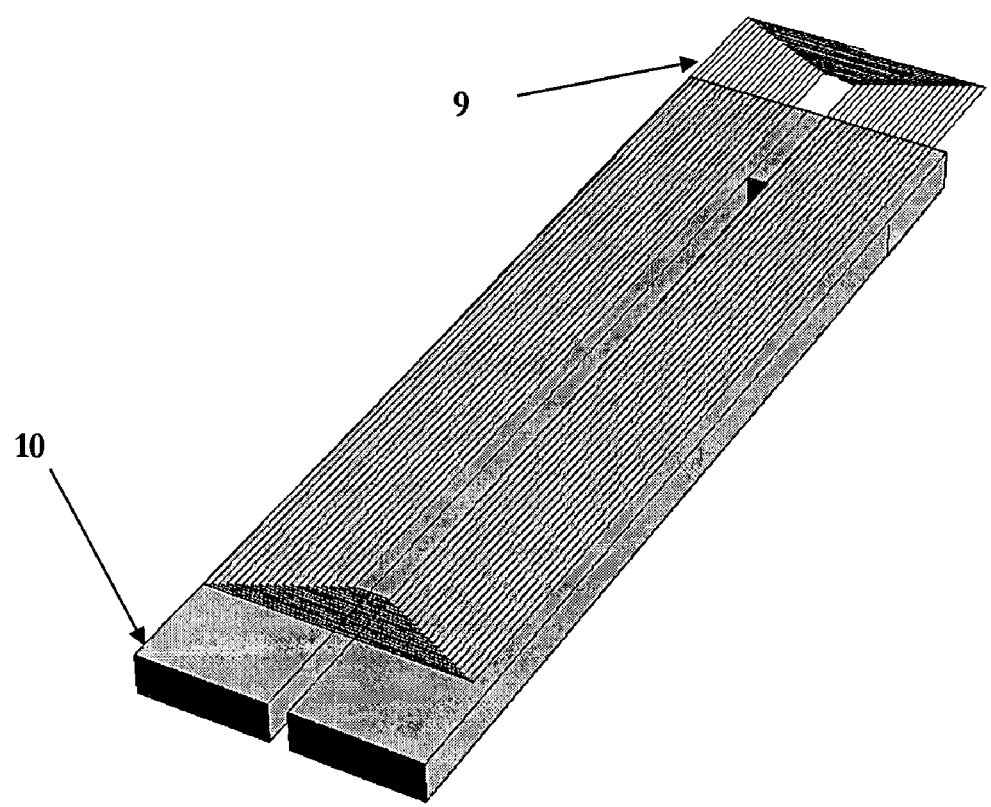
FIG. 5 illustrates a subsection of a coil placed over a bus bar.
Figure 6:
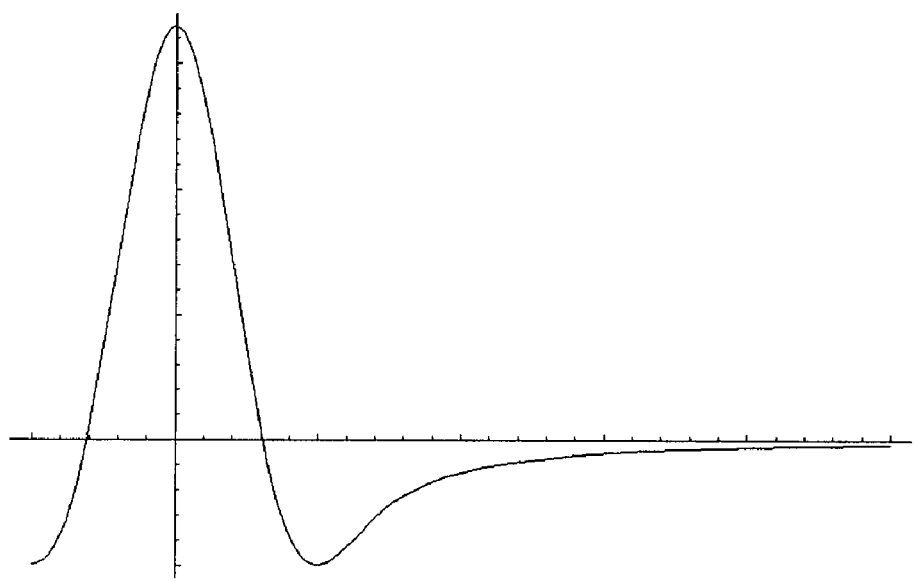
FIG. 6 illustrates the response of the coil in FIG. 5 to a current carrying bus bar displaced by a distance in millimetres, given by the x axis, from the centre of the coil structure.
Figure 7:
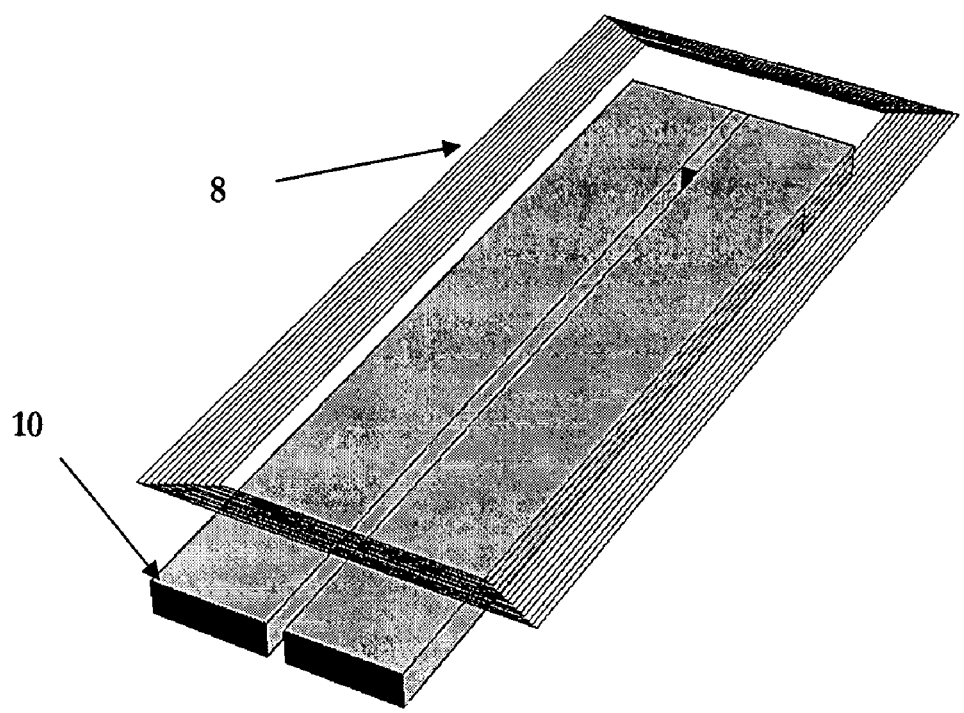
FIG. 7 illustrates a second subsection of a coil placed over a bus bar.
Figure 8:
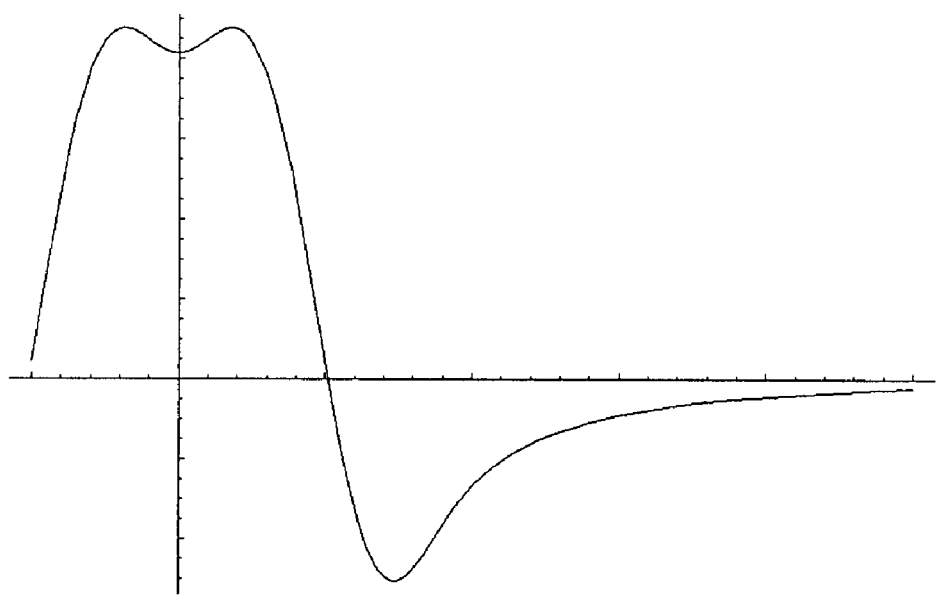
FIG. 8 illustrates a response of the coil in FIG. 7 to a current carrying bus bar displaced by a distance in millimetres, given by the x axis, from the centre of the coil structure.
Figure 9:
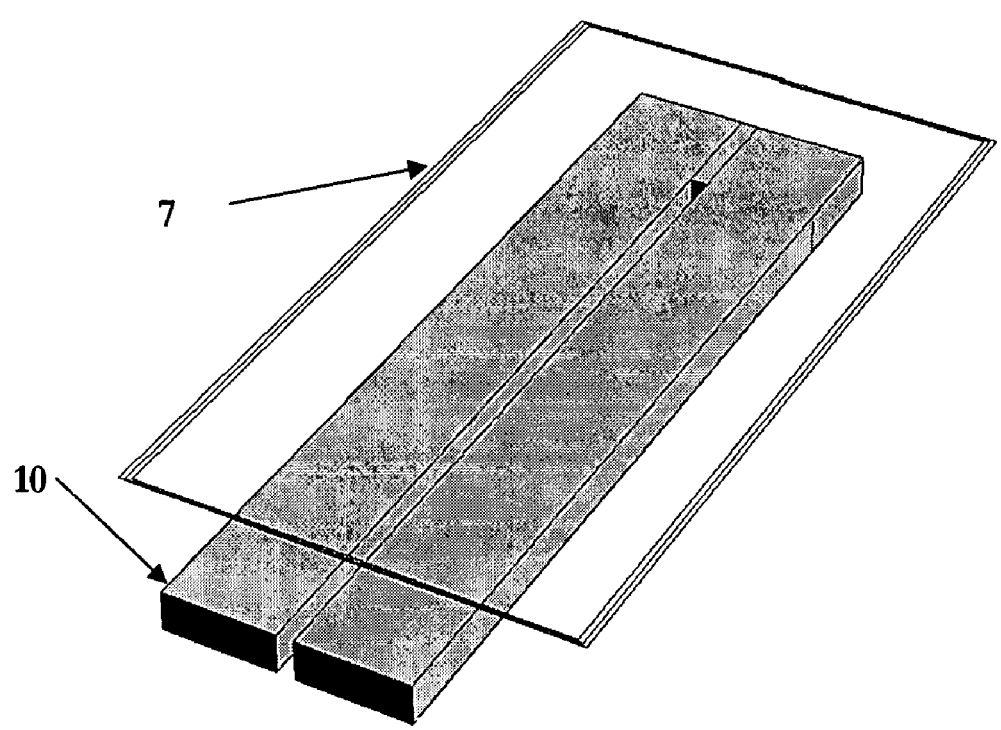
FIG. 9 illustrates a third subsection of a coil placed over a bus bar.
Figure 10:
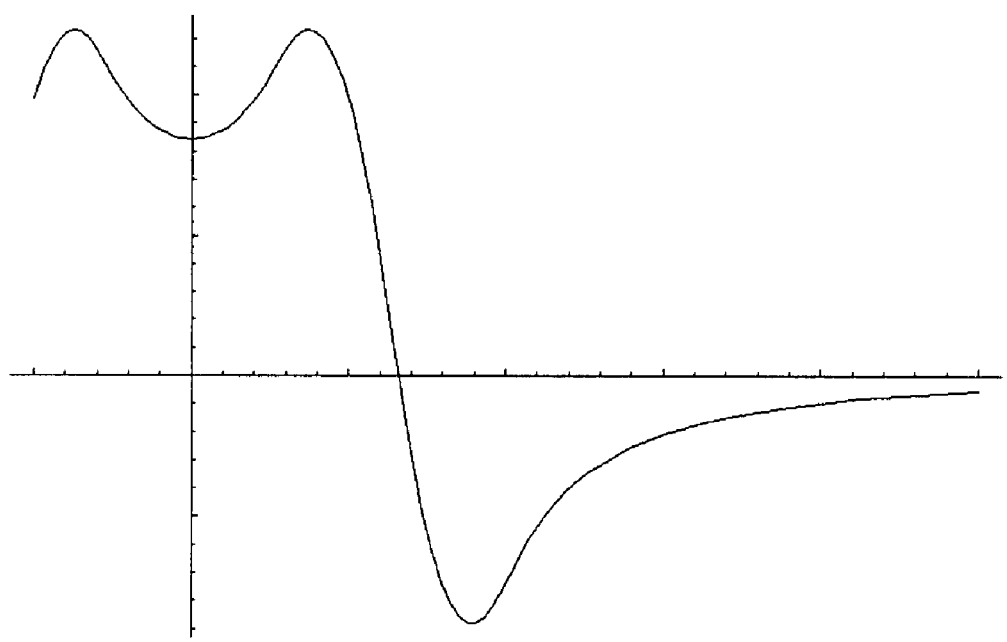
FIG. 10 illustrates the response of the coil in FIG. 9 to a current carrying bus bar displaced by a distance in millimetres, given by the x axis, from the centre of the coil structure.

FIG. 5 shows an example of the first dipole segment 9 in an equivalent coil structure of the coil arrangement 6 of FIG. 3. The response to a current carrying conductor which is moved in relation to the coil structure along 3 in FIG. 1 is shown in FIG. 6. This dipole in this embodiment has a turns-area of 14400 mm$^2$. FIG. 7 and FIG. 8 show the same diagrams for the second coil segment 8. This segment, which has coil turns in the opposite sense, has a response to the bus bar that acts over a larger distance. The turns-area of this section in the example is 23800 mm$^2$, acting in the opposite sense to the dipole in FIG. 5. In FIG. 9 and FIG. 10, the third coil element 7 is shown, acting in the same sense as the dipole in FIG. 5. As the turns-area in this embodiment is only 9400 mm$^2$ the effect is much weaker but extends over a longer distance. When these three elements to the coil are combined then the response of a current carrying bus bar with distance is as shown in FIG. 10. Again it should be understood that the dimensions mentioned is only illustrative and not limited to the invention. In FIGS. 5, 7, 9 the bus bar indicated by reference numeral 10 is of an alternative shape from the bus bar shown in FIG. 1.

Figure 11:
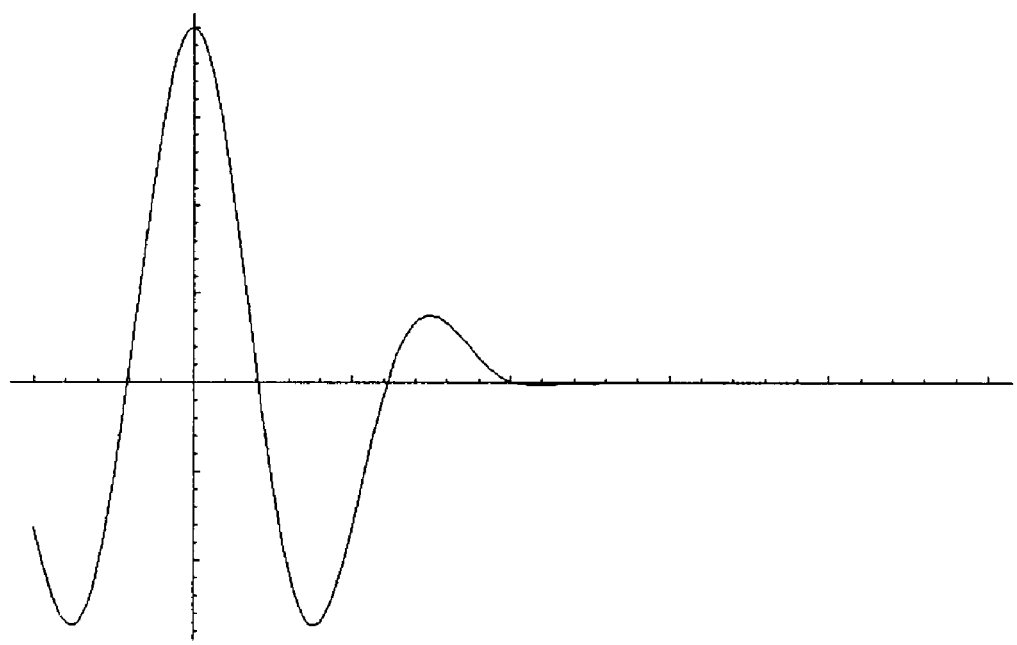
FIG. 11 illustrates an example of the response of the complete coil made from the combination of all three coil sections to a current carrying bus bar displaced by a distance in millimetres, given by the x axis, from the centre of the coil structure.

As with any balanced coil structure the response drops off with distance very rapidly. Because the magnetic system is made up from more than two dipole coils, the system is a magnetic function that is of a higher order than a quadrupole. The higher the order of the magnetic function, the more rapidly the sensitivity drops off with distance. In this embodiment three coils are chosen to balance for an identical bus bar at 29 mm. FIG. 11 shows detail of the response of the coils for a bus bar placed at a distance near 29 mm. The turns-area of the innermost coil and the outer coil can be interchanged to make their combined response match the middle coil segment's response.

Figure 12:
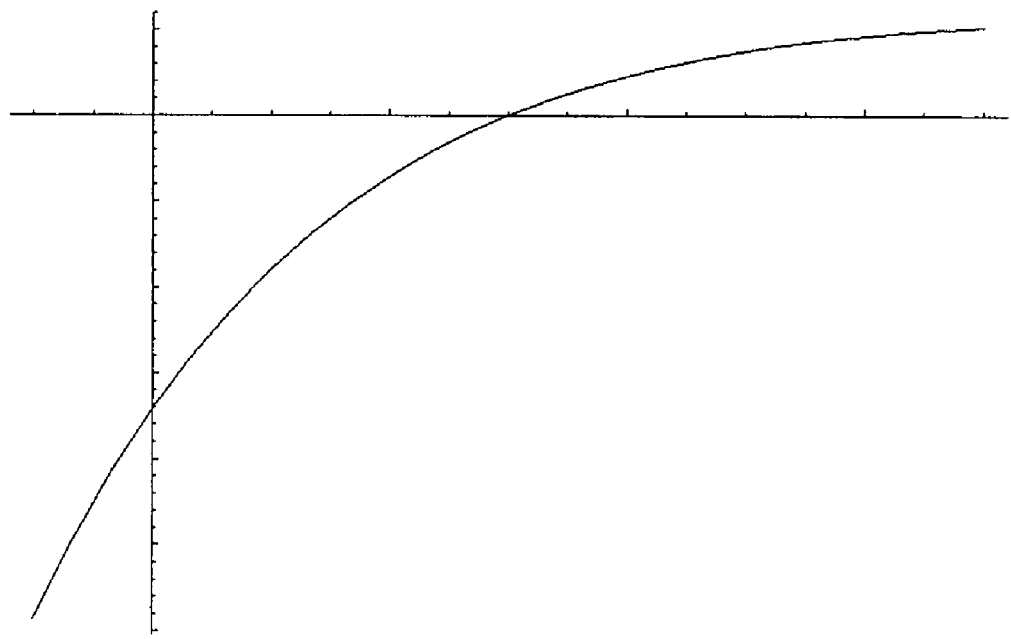
FIG. 12 illustrates a detailed view of FIG. 11 showing a null in the response of a current in a neighbouring bus bar placed at 29 mm from the primary bus bar.

FIG. 12 shows a detail of FIG. 11 close to the null in response near 29 mm from the measured bus bar. The relatively shallow slope in the response demonstrates that there is some tolerance to the exact position of the adjacent bus bars.

In a three-phase electricity meter three or four current bus bars 1, 11, 12 are placed as shown in FIG. 123. The current in each of the phases (and neutral if appropriate for tamper measurement) can be independently measured as there is substantially zero cross-coupling between measurement channels. Typical sensitivity ratios between current in the sensor's own conductor, and in the adjacent conductor, are around 10000:1.

FURTHER EMBODIMENTS

Figure 13:
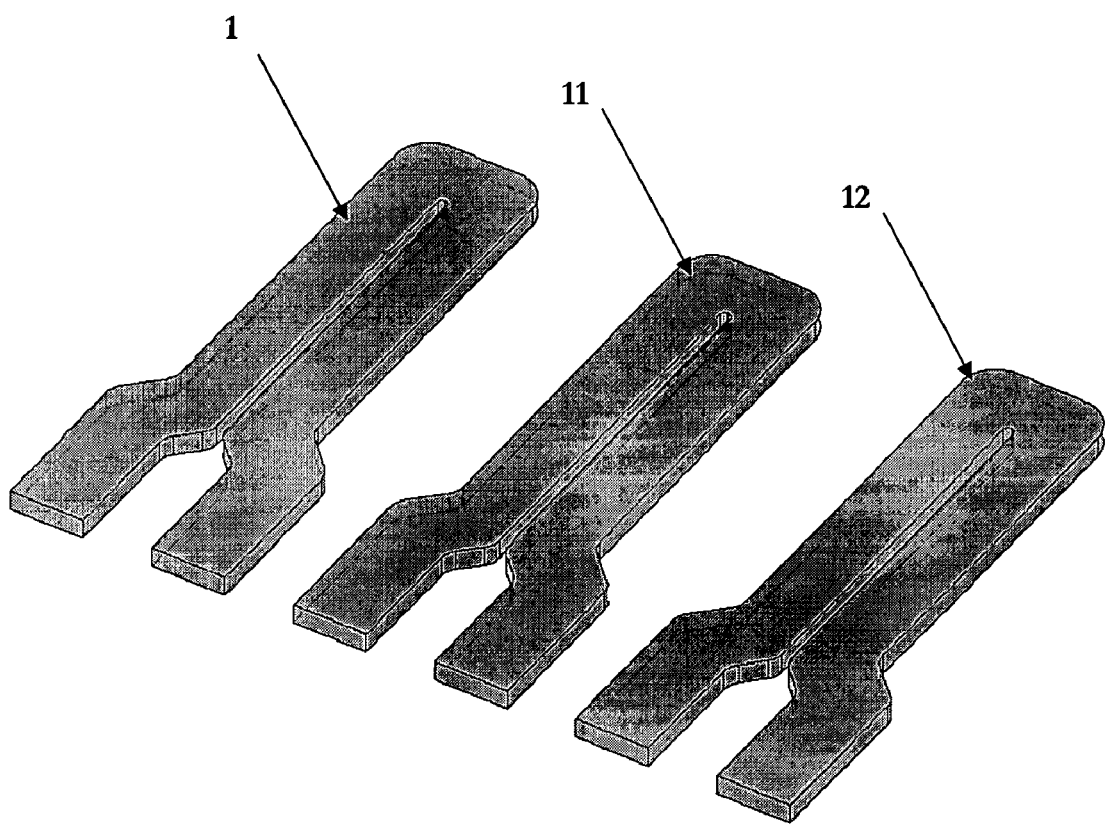
FIG. 13 illustrates an arrangement of three bus bars that are ideally placed to measure current in an IEC form electricity meter.

The three-coil embodiment described above in relation to FIG. 13 may be scaled to any spacing of adjacent conductors, and scaled to different sizes. The length of the hairpin section in FIG. 1 may be altered to change the overall sensitivity of the sensor. The width or thickness of the conductor may be altered, for example, to change the current-carrying capacity. The terminal pitch may be altered to suit a different application. The location of the adjacent current circuits may be altered to suit different applications. In each of these cases, the general principles outlined in the description above are used to optimise the conductor design and coil design to achieve the desired sensitivity to the conductor and immunity to the adjacent conductors.

The coil design concepts above may be extended to more than three dipole segments, if the coil structure is required to be insensitive to conductors at many positions in space. In general, each dipole segment will be tailored to have a different spatial response, such that the superposition of responses at each of the positions of the several adjacent conductors is substantially zero. The more conductor positions that are to be nulled, the greater the number of dipole segments required, and the more complex the optimisation process.

The current sensor assembly may be advantageously constructed using printed circuit board techniques. The resultant coils are rigid, with precisely defined wire positions that allow accurate turns-area balancing for each dipole segment. The current-carrying conductor may be rigidly fixed to the circuit board carrying the coils, for example, using a soldering technique or other fastening means such as using a rivet or screw. For lower currents, the conductor may be formed from one of the layers of the circuit board itself. Multiple sets of coils and conductors may be assembled onto a single circuit board, ensuring that the geometry of the conductors with respect to the coils remains fixed, hence ensuring that the coupling does not vary. The printed circuit board also allows the use of electrostatic screening layers between the conductor and the coils, allowing the conductor to be at an arbitrary potential with respect to the sensor coil without influencing the response. The printed circuit board also allows multiple layers of sensor coil to be fabricated, increasing the sensitivity of the coils, and allowing further flexibility in the design of the coils to optimise the rejection characteristics.

The EMF from the sensor coil is directly proportional to the rate of change of current in the conductor. Techniques for recovering the AC current signal from this, for example, digital integration are well known in the art, and the sensor can be connected directly (aside from basic signal conditioning and anti-alias filtering) to semiconductor devices from a number of manufacturers, including: ADE7758 (Analog Devices), STMP01 (ST Microelectronics), 71M6511 (Teridian), and other similar devices. These devices contain the appropriate signal processing to calculate current, and furthermore to calculate power and energy for metering applications. Such devices may advantageously be integrated on to the same circuit board as the current sensor coil windings themselves but may also be provided on a separate circuit board. This forms the basis of a complete polyphase electricity meter.

Figure 14:
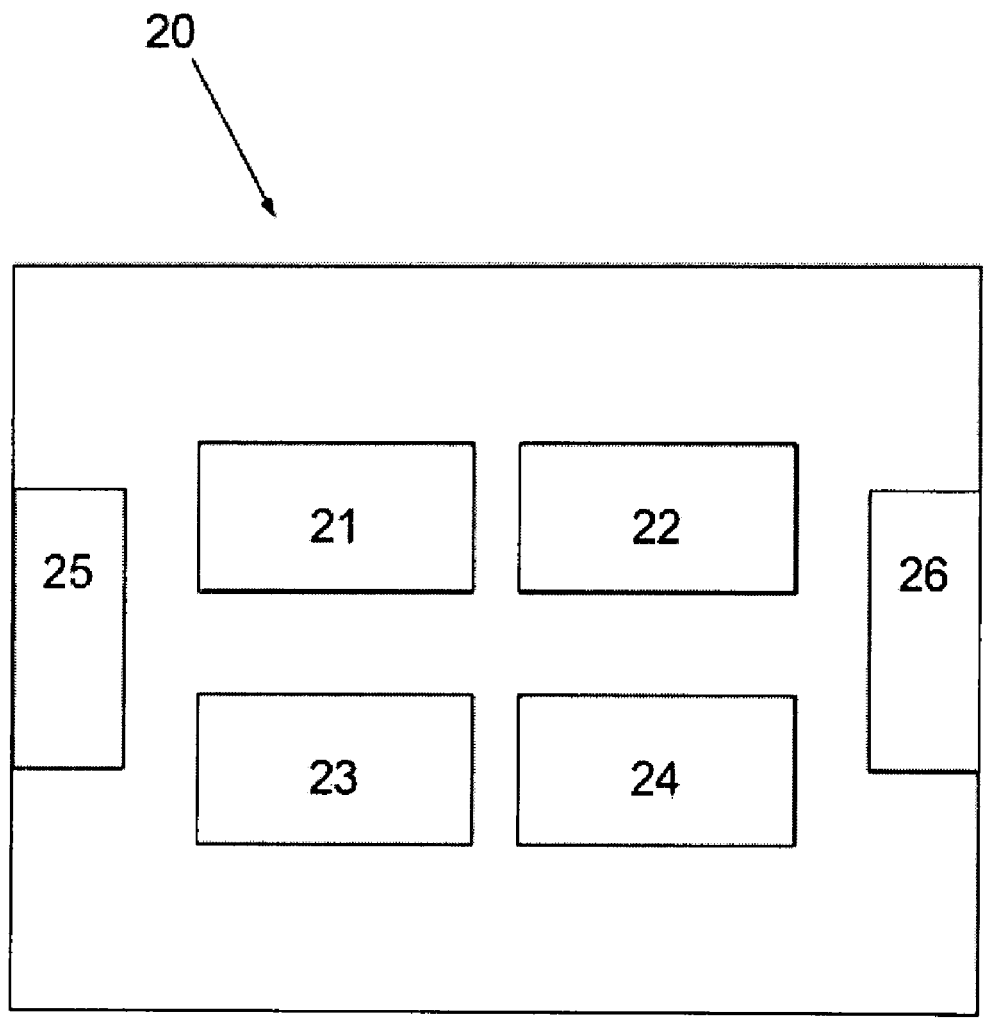
FIG. 14 illustrates a processing device according to the present invention.

FIG. 14 illustrates a processing device 20 that is used for processing the signals obtained by the coils. The processing device 20 comprises at least one processing unit 21, such as a microprocessor, DSP (digital signal processor), Field Programmable Gate Array (FPGA) or specially designed ASIC (Application Specific Integrated Circuit) for running program code for processing, analysing, controlling storage and reporting of measurements. The processing device 20 may further comprise at least one memory unit 22, 23, communication unit 24, and communication interface 25

In some applications the signals from the sensor coils may be digitized in an analogue to digital converter (ADC) 26 and processed in the processing unit 21. The processing unit may alternatively be arranged with an interface (e.g. a serial communication interface such as RS232. RS485, CAN, Interbus or similar interfaces) for acquiring data directly or indirectly from the above mentioned semiconductor devices for processing, storing, and reporting. For this purpose and for storing software for analysis, processing, and reporting at least one type of memory unit 22 may be provided, advantageously at least one non-volatile memory of any suitable type may be provided, for instance a Flash memory or similar electrically controlled non-volatile memory. In some applications a volatile memory 23 is provided for handling program code that is running and/or for storage of temporary data during analysis and processing.

Figure 15:
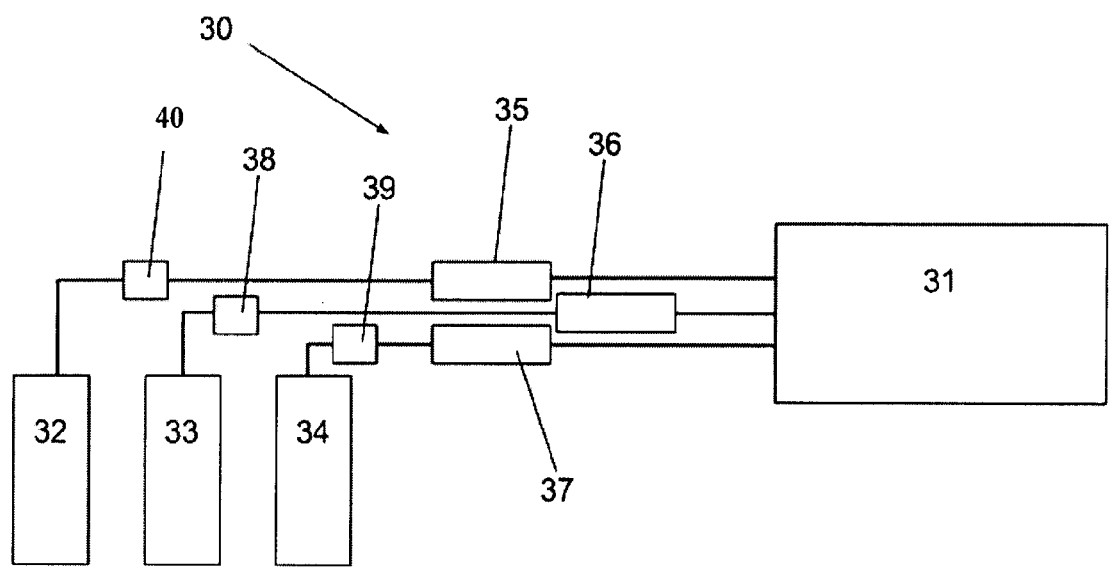
FIG. 15 illustrates a fiscal meter system according to the present invention.

FIG. 15 illustrates an electricity meter 30 according to the present invention where reference numeral 31 generally indicates a processing device such as described in relation to FIG. 14. Reference numerals 32-34 each indicates a coil arrangement 6 together with a bus bar 1, 11, 12. Reference numerals 38-40 indicate optional "pre-processing" units for basic signal conditioning, filtering, anti-aliasing, or similar processing that advantageously can be done using analogue electrical components. Reference numerals 35-37 indicates optional separate processing semiconducting devices for obtaining a relevant current signal. However, in some applications the processing device 31 may provide the same function with appropriate program code operating on digitized signals from the coils.

The electricity meter 30 may further comprise a communication interface 25 and a communication unit 24 for transferring measurements to a central receiving device (not shown). The central receiving device may be arranged for billing purposes to charge for electricity use in relation to the measurements. Communication from the electricity meter to the central receiving device may be provided by any suitable communication type and protocol of wireless or wired technologies. Among wireless communication types one may mention long range protocols like GSM, GPRS, and UMTS but also shorter range protocols like WLAN (Wireless Local Area Network, e.g. 802.11, 802.15, and 802.16 series) or WPAN (Wireless Personal Area Network, e.g. Bluetooth) solutions. Wired technologies may be for instance powerline communication technologies where data may be transferred on the power line on which measurements are conducted or technologies based on a separate communication line (e.g. LAN (Local Area Network, e.g. Ethernet, ATM or similar IP based communication protocols), ADLS variations (Asymmetric Digital Subscriber Line), or PSTN (Public Service Telephony Network) using a modem communication).

The processing unit may be arranged with program code for encrypting data to be transferred and/or providing data to be transferred with a digital signature in order to reduce risks of tampering and fraud.

It should be noted that the word "comprising" does not exclude the presence of other elements or steps than those listed and the words "a" or "an" preceding an element do not exclude the presence of a plurality of such elements. The invention can at least in part be implemented in either software or hardware. It should further be noted that any reference signs do not limit the scope of the claims, and that several "means", "devices", and "units" may be represented by the same item of hardware.

The above mentioned and described embodiments are only given as examples and should not be limiting to the present invention. Other solutions, uses, objectives, and functions within the scope of the invention as claimed in the below described patent claims should be apparent for the person skilled in the art.

The invention claimed is:

1. A current sensor comprising a coil arrangement with an equivalent coil structure of at least three sense coil segments arranged to be located in close proximity to a current conductor in an electricity meter; wherein the sense coil segments are mounted in fixed relation in at least one direction to the current conductor; and a magnetic centre of each sense coil segment is co-located with each other; a first coil segment of said at least three sense coil segments having a number of coil turns wound in a first sense; a second coil segment of said at least three sense coil segments having a number of coil turns wound in an opposite sense to said first coil segment; and a third coil segment of said at least three sense coil segments having a number of coil turns wound in said first sense; the sense coil segments being connected in series; and wherein said at least three coil segments are configured to have different spatial responses; wherein a combined response of signals relative the current in the current conductor from the coil arrangement is proportional to the rate of change of current in the current conductor, and is substantially insensitive to a uniform external AC magnetic field, to a first-order gradient AC magnetic field, and to current in at least one other current-carrying conductor in said electricity meter; said other current-carrying conductor being located in a defined location relative the coil arrangement.

2. The sensor according to claim 1, wherein each turn of said second coil segment encloses each turn of said first coil segment, and each turn of said third coil segment encloses each turn of both said first and second coil segments.

3. The sensor according to claim 1, wherein said at least three coil segments are arranged such that the electromagnetic forces induced in each of the coils by a uniform AC magnetic field sum substantially to zero in the coil arrangement.

4. The sensor according to claim 1, wherein at least a portion of the current-carrying conductor is substantially hairpin in shape, such that the magnetic field produced by current flowing in the conductor falls off faster with distance than the field from a straight conductor of similar dimensions.

5. The sensor according to claim 1, wherein the current-carrying conductor generates magnetic field from the current flowing in the conductor that falls off faster with distance than the field from current flowing in a straight conductor of similar dimensions.

6. The sensor according to claim 1, wherein said at least three coil segments lie in at least one plane that is substantially parallel to each other.

7. The sensor according to claim 1, wherein said coil segments are disposed on or in a substantially planar support.

8. The sensor according to claim 1, wherein said at least three coil segments each have different turns-area.

9. The sensor according to claim 8, wherein a sum of the turns-area of said at least three coil segments, taking into account the sense of the winding by the sign of the turns-area product, is substantially zero.

10. The sensor according to claim 1, wherein a turns-area of one of the coil segments is substantially equal to the sum of the turns-area of the other two coil segments.

11. The sensor according to claim 1, wherein the coil segments are fabricated on at least one layers of a printed circuit board.

12. The sensor according to claim 11, wherein the printed circuit board also comprise electrostatic shield layers disposed between the conductor and said at least three coil segments.

13. The sensor according to claim 11, wherein the current conductor is formed on at least one layers of said printed circuit board.

14. The sensor according to claim 11, wherein said printed circuit board also has other electronic components disposed on at least one surface.

15. An arrangement of sensors according to claim 1, wherein the arrangement is permanently arranged and optimized such that the response of each separate sensor to current flowing in an at least one immediately adjacent sensor is substantially zero.

16. The arrangement of claim 15, wherein the arrangement is further characterised in that the response of each sensor to current in every other sensor in the arrangement is substantially zero.

17. A watt-hour electricity meter arranged with at least one sensor according to claim 1 and arranged with means for measuring at least one of electrical energy, power, and current.

18. The meter according to claim 17, further comprising communication means for communicating measurements to an external device.

* * * * *